United States Patent
Kopp

(10) Patent No.: US 10,223,656 B2
(45) Date of Patent: Mar. 5, 2019

(54) METHOD AND SYSTEM FOR MINIMIZING TIME-VARIANT ENERGY DEMAND AND CONSUMPTION OF BUILT ENVIRONMENT

(71) Applicant: Conectric, LLC, Lewes, DE (US)

(72) Inventor: Phillip Kopp, San Diego, CA (US)

(73) Assignee: Conectric, LLC, Lewes, DE (US)

( * ) Notice: Subject to any disclaimer, the term of this patent is extended or adjusted under 35 U.S.C. 154(b) by 105 days.

(21) Appl. No.: 15/590,104

(22) Filed: May 9, 2017

(65) Prior Publication Data

US 2017/0329291 A1    Nov. 16, 2017

Related U.S. Application Data

(60) Provisional application No. 62/334,367, filed on May 10, 2016.

(51) Int. Cl.
*G05B 15/02* (2006.01)
*G01R 1/36* (2006.01)
(Continued)

(52) U.S. Cl.
CPC ........ *G06Q 10/06312* (2013.01); *F24F 11/30* (2018.01); *F24F 11/62* (2018.01);
(Continued)

(58) Field of Classification Search
CPC .. G05B 15/02; G05B 13/041; G05B 23/0243; G05B 23/0294; G05B 23/024; G05B 23/0281; H02J 13/0086; H02J 13/0075; H02J 13/0055; H02J 50/80; H02J 13/0017; H02J 3/32; H02J 3/14; H02J 3/00; H02J 2003/146; H02J 3/383; H02J 3/386; H02J 2003/003; H02J 2003/007; G01R 1/36; F24F 11/30; F24F 11/62; G06F 17/18;
(Continued)

(56) References Cited

U.S. PATENT DOCUMENTS 8,457,802 B1 * 6/2013 Steven ............... G06Q 10/00
700/291
2010/0138363 A1 * 6/2010 Batterberry ............ G06Q 10/04
705/412

(Continued)

*Primary Examiner* — Robert E Fennema
*Assistant Examiner* — Jigneshkumar C Patel
(74) *Attorney, Agent, or Firm* — Procopio, Cory, Hargreaves & Savitch LLP

(57) ABSTRACT

A computer-implemented method and system is provided. The system manipulates load curves corresponding to time-variant energy demand and consumption of a built environment. The system analyzes a first, second, third, fourth and a fifth set of data. The first set of data is associated with energy consuming devices. The second set of data is associated with an occupancy behavior of users. The third set of data is associated with energy storage and supply means. The fourth set of data is associated with environmental sensors. The fifth set of data is associated with energy pricing models. The system executes control routines for controlling peak loading conditions associated with the built environment. The system manipulates an optimized operating state of the energy consuming devices. The system integrates the energy storage and supply means for optimal reduction of the peak level of energy demand concentrated over the limited period of time.

20 Claims, 5 Drawing Sheets

(51) Int. Cl.

| | | |
|---|---|---|
| *G05B 13/04* | (2006.01) | |
| *G05B 23/02* | (2006.01) | |
| *G06F 17/18* | (2006.01) | |
| *G05F 1/66* | (2006.01) | |
| *G06Q 50/06* | (2012.01) | |
| *H02J 13/00* | (2006.01) | |
| *H02J 50/80* | (2016.01) | |
| *H02J 3/32* | (2006.01) | |
| *H05B 37/02* | (2006.01) | |
| *H02J 3/14* | (2006.01) | |
| *H02J 3/00* | (2006.01) | |
| *H02J 3/38* | (2006.01) | |
| *F24F 11/30* | (2018.01) | |
| *F24F 11/62* | (2018.01) | |
| *G06Q 10/06* | (2012.01) | |
| *H02J 9/06* | (2006.01) | |
| *H02J 15/00* | (2006.01) | |
| *G06F 1/26* | (2006.01) | |
| *H02J 1/00* | (2006.01) | |

(52) U.S. Cl.
CPC ............. *G01R 1/36* (2013.01); *G05B 13/041* (2013.01); *G05B 15/02* (2013.01); *G05B 23/024* (2013.01); *G05B 23/0243* (2013.01); *G05B 23/0281* (2013.01); *G05B 23/0294* (2013.01); *G05F 1/66* (2013.01); *G06F 1/26* (2013.01); *G06F 17/18* (2013.01); *G06Q 50/06* (2013.01); *H02J 3/00* (2013.01); *H02J 3/008* (2013.01); *H02J 3/14* (2013.01); *H02J 3/32* (2013.01); *H02J 3/382* (2013.01); *H02J 9/061* (2013.01); *H02J 13/0017* (2013.01); *H02J 13/0055* (2013.01); *H02J 13/0075* (2013.01); *H02J 13/0086* (2013.01); *H02J 15/00* (2013.01); *H02J 50/80* (2016.02); G05B 2219/24048 (2013.01); H02J 3/383 (2013.01); H02J 3/386 (2013.01); H02J 2001/004 (2013.01); H02J 2003/003 (2013.01); H02J 2003/007 (2013.01); H02J 2003/146 (2013.01); Y02B 70/3225 (2013.01); Y02E 40/76 (2013.01); Y04S 10/54 (2013.01); Y04S 10/545 (2013.01); Y04S 10/60 (2013.01); Y04S 20/222 (2013.01)

(58) Field of Classification Search
CPC . G05F 1/66; G06Q 50/06; Y04S 10/54; Y04S 10/545; Y04S 10/60; Y02E 40/76; H05B 37/02
USPC .......................................................... 700/291
See application file for complete search history.

(56) References Cited

U.S. PATENT DOCUMENTS

| | | | | |
|---|---|---|---|---|
| 2012/0296482 | A1* | 11/2012 | Steven | G06Q 50/06 700/291 |
| 2013/0218355 | A1* | 8/2013 | Lazaris | G06Q 30/0605 700/291 |
| 2014/0222225 | A1* | 8/2014 | Rouse | H02J 13/0079 700/291 |
| 2014/0277769 | A1* | 9/2014 | Matsuoka | F24F 11/30 700/278 |
| 2016/0190805 | A1* | 6/2016 | Steven | G06Q 30/0283 700/291 |

* cited by examiner

METHOD AND SYSTEM FOR MINIMIZING TIME-VARIANT ENERGY DEMAND AND CONSUMPTION OF BUILT ENVIRONMENT

CROSS-REFERENCES TO RELATED APPLICATION

The present application claims the benefit under 35 U.S.C. § 119(e) of the filing date of U.S. Provisional Patent Application Ser. No. 62/334,367 for PHILLIP KOPP, filed May 10, 2016, which is hereby incorporated by reference in its entirety for all purposes.

TECHNICAL FIELD

The present disclosure relates to a field of energy management system. More specifically, the present disclosure relates to a method and system for manipulating load curves corresponding to time-variant energy demand and consumption of a built environment associated with one or more renewable energy sources.

BACKGROUND

Over the last few decades, increasing population and energy requirements to power modern transportation and electronic technologies result in a rapid development in energy generation and distribution technology. In order to meet the energy generation and distribution requirements, energy utilities depend mostly on the non-renewable energy sources like fossil fuels which produce a high amount of carbon emissions. Refinement processes of fossil fuels and/or its by-products and their combustion to drive electric generators have contributed as one of the major cause of excessive carbon emissions. The release of carbon and other chemical by-products into the atmosphere has impacted temperatures and climate patterns on a global scale. The increased awareness of the impacts of carbon emissions from the use of fossil fueled electric generation along with the increased cost of producing high power during peak load conditions has increased the need for alternative solutions. These alternative solutions are referred to as renewable energy sources, which may be used to generate electricity. These renewable energy sources may be applied to electric drive trains, electric automation and transportation, without the need to extract, transport, refine, combust, and release carbon-based fossil fuels. Renewable energy comes in many forms, but significantly is generated by capturing energy from natural, non-carbon intensive sources such as wind, sunlight, water movement, geothermal and other new sources as they are discovered and improved. Unlike fossil fuels and/or its by-products, these renewable energy sources are complex in nature as they are intermittent and cannot be controlled actively by humans. This enhances the probability of occurrence of certain time periods where power production far exceeds demands or certain time periods where power production falls short of demands. This creates major challenges for energy utilities to make investments, generate power for sale and profit. Also, this creates major challenges for the markets in establishing a price of energy for consumers. Nowadays, energy storage means are deployed to store energy when power production is excessive and release energy when demands exceed power production output. These energy storage means include but may not be limited to batteries and sophisticated power banks. However, there are many limitations to the effective installation of the energy storage means due to sizing requirements, specific load profiles and other attributes which must be matched very carefully in order to provide feasible economic returns.

SUMMARY

In a first example, a computer-implemented method is provided. The computer-implemented method for manipulation of load curves corresponding to time-variant energy demand and consumption of a built environment associated with one or more renewable energy sources. The computer-implemented method may include a first step of analysis of a first set of statistical data, a second set of statistical data, a third set of statistical data, a fourth set of statistical data and a fifth set of statistical data. The first set of statistical data is associated with a plurality of energy consuming devices. The second set of statistical data is associated with an occupancy behavior of a plurality of users. The third set of statistical data is associated with a plurality of energy storage and supply means. The fourth set of statistical data is associated with a plurality of environmental sensors and a fifth set of statistical data is associated with a plurality of energy pricing models. The computer-implemented method may include a second step of execution of one or more control routines for controlling peak loading conditions associated with the built environment. The computer-implemented method may include a third step of manipulation of an optimized operating state of each of the plurality of energy consuming devices. The computer-implemented method may include a fourth step of integration of the plurality of energy storage and supply means for providing an equivalent real time energy supply to selected energy consuming devices of the plurality of energy consuming devices. The analysis may be done by performing one or more statistical functions to generate a plurality of statistical results. The execution may be performed based on the plurality of statistical results. The one or more control routines may be executed by performing at least one of a plurality of control techniques. The plurality of control techniques may be performed for generation of an optimized time variant energy demand and consumption and rendering one or more gradual load curves associated with the built environment. The operating state of the plurality of energy consuming devices may be manipulated by time-variant shifting of energy usage of each selected energy consuming device of the plurality of energy consuming devices in a scheduled energy usage profile of the selected energy consuming device of the plurality of energy consuming devices. The time-variant shifting and scheduling may be performed for generation of a peak level of energy demand concentrated over a limited period of time and rendering one or more steep load curves associated with the built environment. The integration may be performed based on validation of an increase in the energy demand above a threshold level. The integration may be performed for optimally reducing the peak level of energy demand concentrated over the limited period of time. The optimal reduction of the peak level of energy demand provides at least one of a first potential for optimum charge and a second potential of optimum discharge of the plurality of energy storage and supply means over a period of time.

In a second example, a computer system is provided. The computer system may include one or more processors and a memory coupled to the one or more processors. The memory may store instructions which, when executed by the one or more processors, may cause the one or more processors to perform a method. The method manipulates load curves corresponding to time-variant energy demand and consumption of a built environment associated with one or more renewable energy sources. The method may include a first step of analysis of a first set of statistical data, a second set of statistical data, a third set of statistical data, a fourth set of statistical data and a fifth set of statistical data. The first set of statistical data is associated with a plurality of energy consuming devices. The second set of statistical data is associated with an occupancy behavior of a plurality of users. The third set of statistical data is associated with a plurality of energy storage and supply means. The fourth set of statistical data is associated with a plurality of environmental sensors and a fifth set of statistical data is associated with a plurality of energy pricing models. The method may include a second step of execution of one or more control routines for controlling peak loading conditions associated with the built environment. The method may include a third step of manipulation of an optimized operating state of each of the plurality of energy consuming devices. The method may include a fourth step of integration of the plurality of energy storage and supply means for providing an equivalent real time energy supply to selected energy consuming devices of the plurality of energy consuming devices. The analysis may be done by performing one or more statistical functions to generate a plurality of statistical results. The execution may be performed based on the plurality of statistical results. The one or more control routines may be executed by performing at least one of a plurality of control techniques. The plurality of control techniques may be performed for generation of an optimized time variant energy demand and consumption and rendering one or more gradual load curves associated with the built environment. The operating state of the plurality of energy consuming devices may be manipulated by time-variant shifting of energy usage of each selected energy consuming device of the plurality of energy consuming devices in a scheduled energy usage profile of the selected energy consuming device of the plurality of energy consuming devices. The time-variant shifting and scheduling may be performed for generation of a peak level of energy demand concentrated over a limited period of time and rendering one or more steep load curves associated with the built environment. The integration may be performed based on validation of an increase in the energy demand above a threshold level. The integration may be performed for optimally reducing the peak level of energy demand concentrated over the limited period of time. The optimal reduction of the peak level of energy demand provides at least one of a first potential for optimum charge and a second potential for optimum discharge of the plurality of energy storage and supply means over a period of time.

In a third example, a computer-readable storage medium is provided. The computer-readable storage medium encodes computer executable instructions that, when executed by at least one processor, performs a method. The method manipulates load curves corresponding to time-variant energy demand and consumption of a built environment associated with one or more renewable energy sources. The method may include a first step of analysis of a first set of statistical data, a second set of statistical data, a third set of statistical data, a fourth set of statistical data and a fifth set of statistical data. The first set of statistical data is associated with a plurality of energy consuming devices. The second set of statistical data is associated with an occupancy behavior of a plurality of users. The third set of statistical data is associated with a plurality of energy storage and supply means. The fourth set of statistical data is associated with a plurality of environmental sensors and a fifth set of statistical data is associated with a plurality of energy pricing models. The method may include a second step of execution of one or more control routines for controlling peak loading conditions associated with the built environment. The method may include a third step of manipulation of an optimized operating state of each of the plurality of energy consuming devices. The method may include a fourth step of integration of the plurality of energy storage and supply means for providing an equivalent real time energy supply to selected energy consuming devices of the plurality of energy consuming devices. The analysis may be done by performing one or more statistical functions to generate a plurality of statistical results. The execution may be performed based on the plurality of statistical results. The one or more control routines may be executed by performing at least one of a plurality of control techniques. The plurality of control techniques may be performed for generation of an optimized time variant energy demand and consumption and rendering one or more gradual load curves associated with the built environment. The operating state of the plurality of energy consuming devices may be manipulated by time-variant shifting of energy usage of each selected energy consuming device of the plurality of energy consuming devices in a scheduled energy usage profile of the selected energy consuming device of the plurality of energy consuming devices. The time-variant shifting and scheduling may be performed for generation of a peak level of energy demand concentrated over a limited period of time and rendering one or more steep load curves associated with the built environment. The integration may be performed based on validation of an increase in the energy demand above a threshold level. The integration may be performed for optimally reducing the peak level of energy demand concentrated over the limited period of time. The optimal reduction of the peak level of energy demand provides at least one of a first potential for optimum charge and a second potential of optimum discharge of the plurality of energy storage and supply means over a period of time.

BRIEF DESCRIPTION OF THE FIGURES

Figure 1:
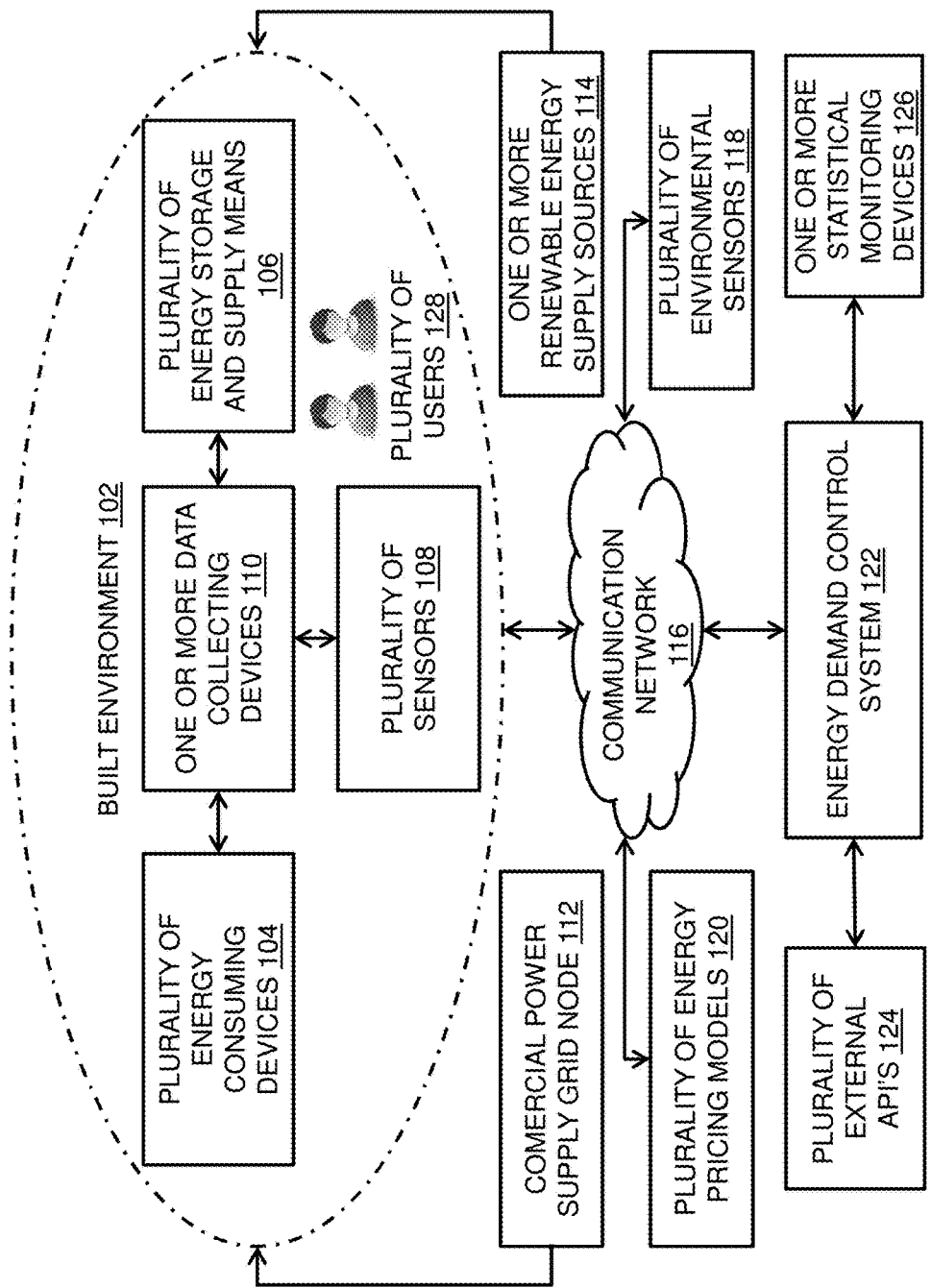
Figure 2:
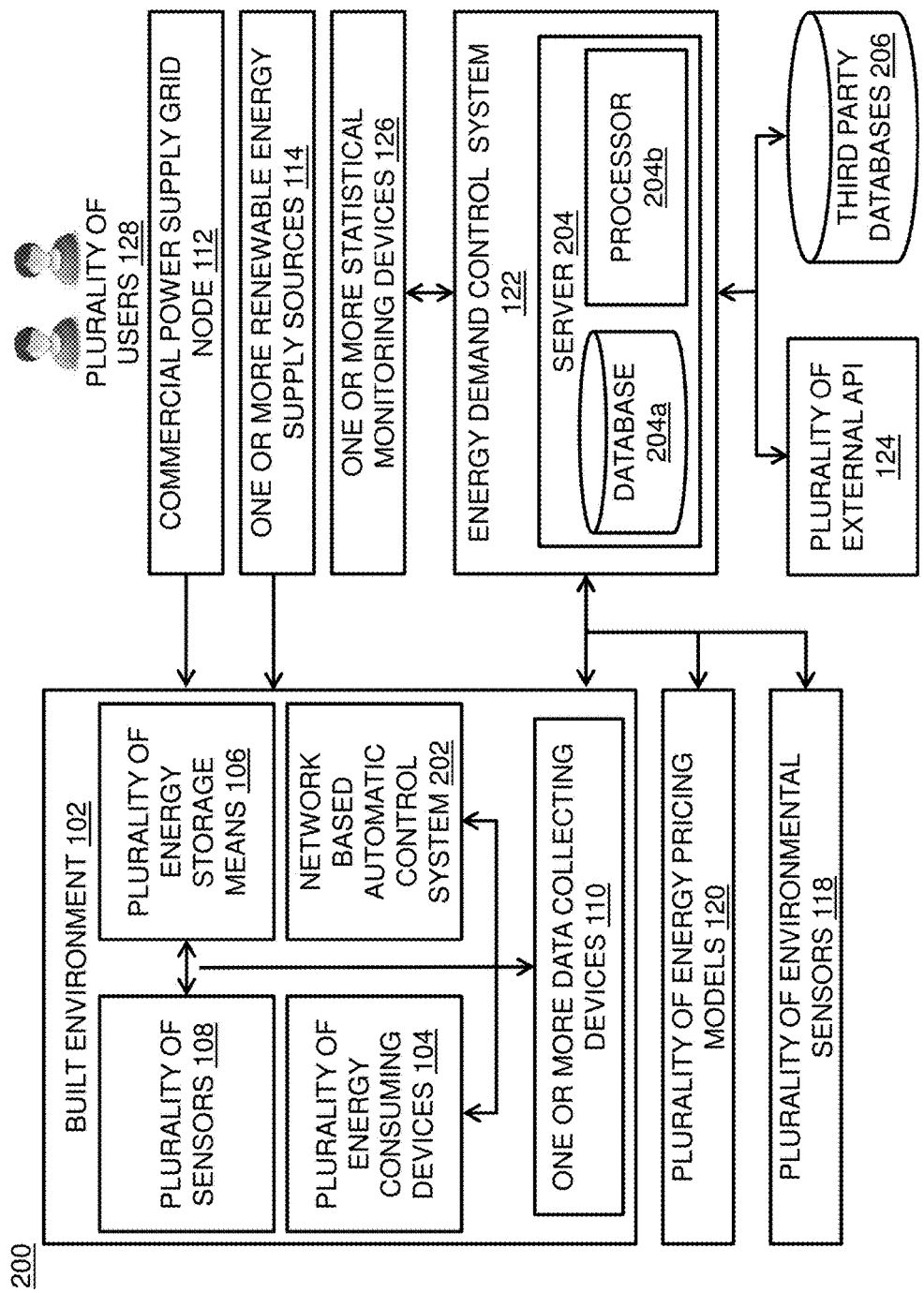
Figure 3:
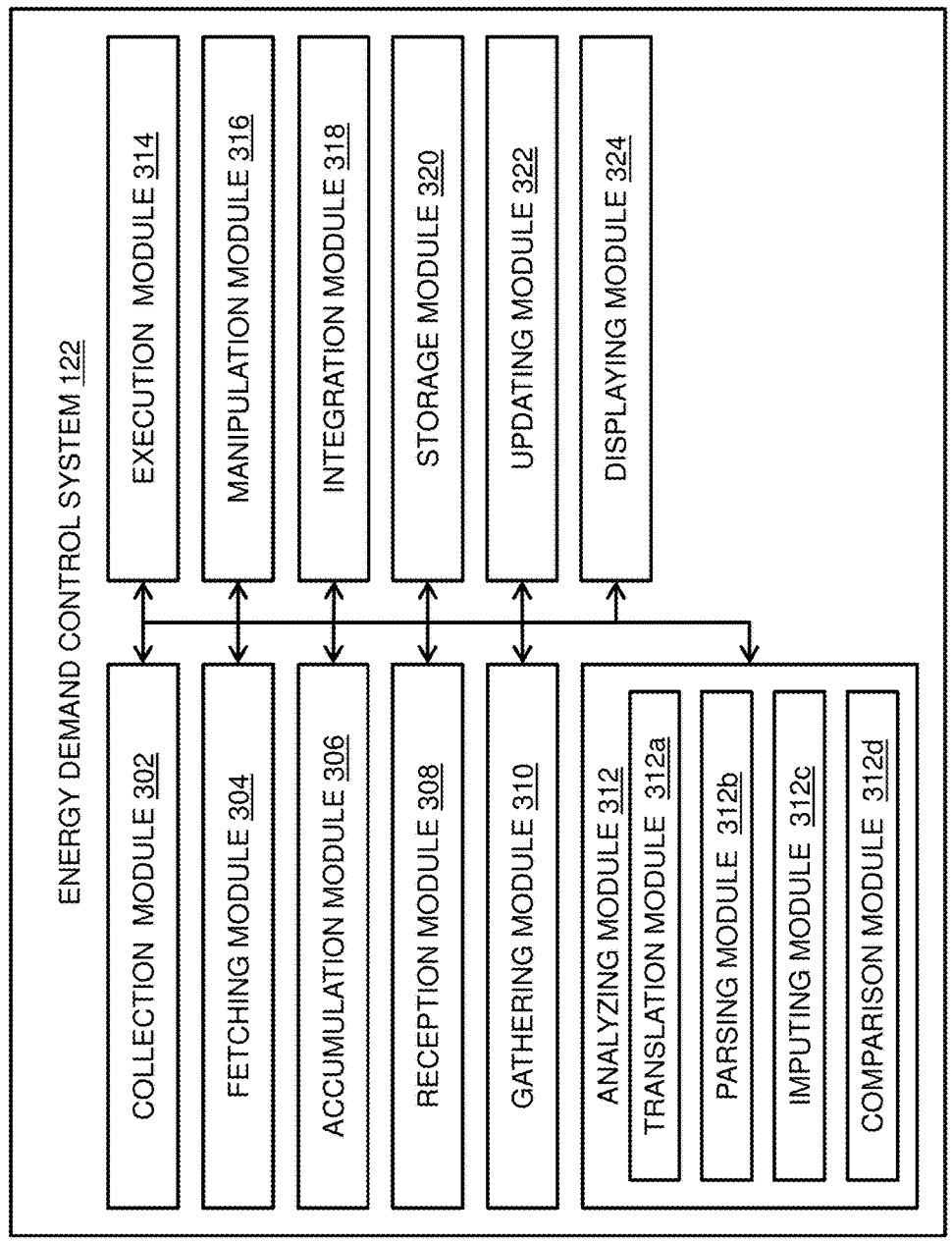
Figure 4:
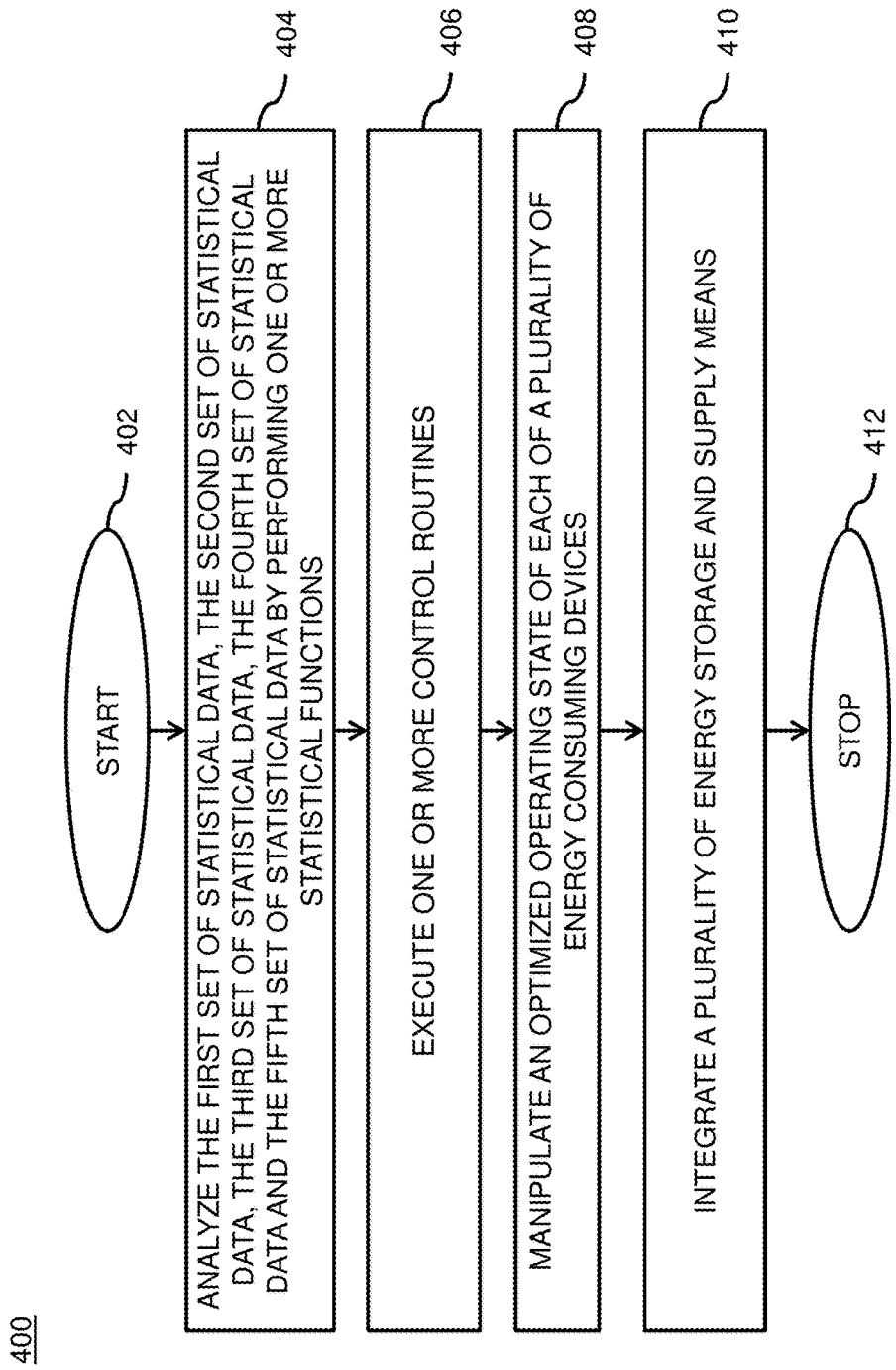
Figure 5:
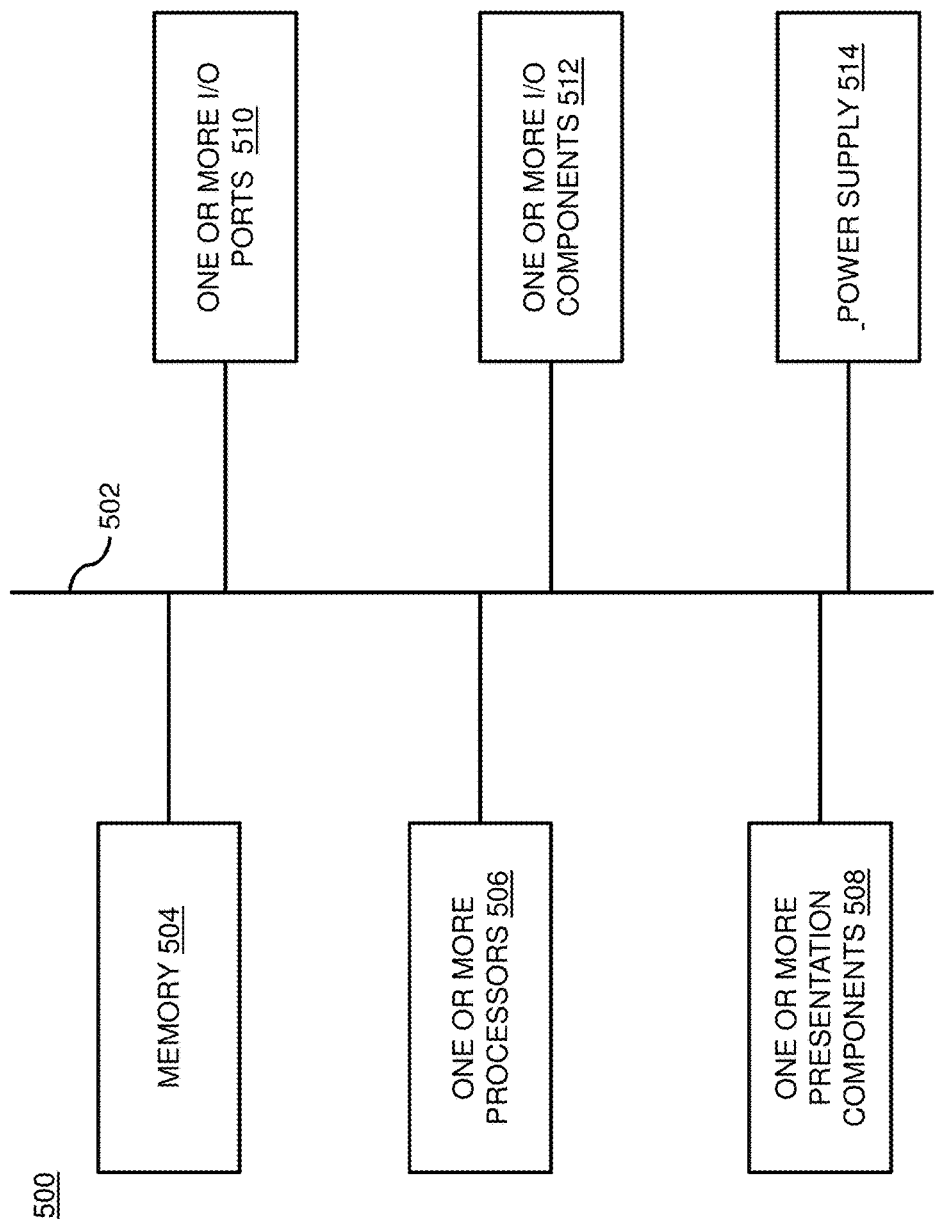

Having thus described the invention in general terms, reference will now be made to the accompanying drawings, which are not necessarily drawn to scale, and wherein:

FIG. 1 illustrates an interactive environment for manipulating load curves corresponding to time-variant energy demand and consumption of a built environment, in accordance with various embodiments of the present disclosure;

FIG. 2 illustrates a block diagram for manipulating the load curves corresponding to the time-variant energy demand and consumption of the built environment, in accordance with various embodiments of the present disclosure;

FIG. 3 illustrates a block diagram of an energy demand control system, in accordance with various embodiments of the present disclosure;

FIG. 4 illustrates a flow chart for manipulating the load curves, in accordance with various embodiments of the present disclosure; and FIG. 5 illustrates a block diagram of a communication device, in accordance with various embodiments of the present disclosure.

It should be noted that the accompanying figures are intended to present illustrations of exemplary embodiments of the present disclosure. These figures are not intended to limit the scope of the present disclosure. It should also be noted that accompanying figures are not necessarily drawn to scale.

DETAILED DESCRIPTION

In the following description, for purposes of explanation, numerous specific details are set forth in order to provide a thorough understanding of the present technology. It will be apparent, however, to one skilled in the art that the present technology can be practiced without these specific details. In other instances, structures and devices are shown in block diagram form only in order to avoid obscuring the present technology.

Reference in this specification to "one embodiment" or "an embodiment" means that a particular feature, structure, or characteristic described in connection with the embodiment is included in at least one embodiment of the present technology. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Moreover, although the following description contains many specifics for the purposes of illustration, anyone skilled in the art will appreciate that many variations and/or alterations to said details are within the scope of the present technology. Similarly, although many of the features of the present technology are described in terms of each other, or in conjunction with each other, one skilled in the art will appreciate that many of these features can be provided independently of other features. Accordingly, this description of the present technology is set forth without any loss of generality to, and without imposing limitations upon, the present technology.

FIG. 1 illustrates an interactive environment for manipulating load curves corresponding to time-variant energy demand and consumption of a built environment, in accordance with various embodiment of the present disclosure. The interactive environment facilitates assimilation and analysis of energy conditions associated with the one or more built environments. The energy conditions include but may not be limited to energy demand, energy consumption, energy expenses and energy use intensity. The energy conditions are utilized for execution of one or more control routines to control peak loading conditions and abrupt changes in energy pricing associated with the one or more built environments. In addition, the energy conditions are utilized for manipulation of load curves to efficiently reduce the time-variant energy demand and consumption of the one or more built environments.

The interactive environment is characterized by the interaction of a built environment 102, a plurality of energy consuming devices 104, a plurality of energy storage and supply means 106, a plurality of sensors 108 and one or more data collecting devices 110. In addition, the interactive environment is characterized by the interaction of a commercial power supply grid node 112, one or more renewable energy supply sources 114 and a communication network 116. Furthermore, the interactive environment is characterized by the interaction of a plurality of environmental sensors 118 and a plurality of energy pricing models 120. Moreover, the interactive environment is characterized by the interaction of a energy demand control system 122, a plurality of external application program interfaces 124 (hereafter "APIs") and one or more statistical monitoring devices 126.

In general, the built environment 102 is a closed or semi-closed structure with one or more number of floors utilized for specific purposes. Each built environment are utilized to perform a pre-defined operations and maintenance based on types of services provided by the built environment 102. The types of services include hospitality, travel, work, entertainment, manufacturing and the like. In addition, each type of service provided decides a scale of the operations and maintenance of the built environment 102. The type of services and the maintenance pertains to the energy consumption associated with each of the plurality of energy consuming devices 104. Examples of the built environment 102 includes but may not be limited to an office, a mall, an airport, a stadium, a hotel and a manufacturing plant.

The built environment 102 utilizes energy for operations and maintenance of the built environment 102. The built environment 102 obtains the energy from a plurality of energy generation and supply sources. The plurality of energy generation and supply sources include but may not be limited to the commercial power supply grid node 112 and the one or more renewable energy supply sources 114. The commercial power supply grid node 112 corresponds to a network of power lines, a plurality of transformers and one or more equipment employed for the transmission and distribution of the alternate current power to the built environment 102. Further, the one or more renewable energy supply sources 114 include but may not be limited to one or more windmills and a plurality solar photovoltaic panels.

In an embodiment of the present disclosure, the one or more renewable energy supply sources 114 are deployed at the built environment 102. In an example, the plurality of solar photovoltaic panels are installed at the residential or commercial rooftops. In another embodiment of the present disclosure, the one or more renewable energy supply sources 114 are deployed at a remote location from the built environment 102. In an example, the one or more windmills are deployed at countryside farmland. In an embodiment of the present disclosure, the one or more renewable energy supply sources 114 is directly connected to the plurality of energy storage and supply means 106 associated with the built environment 102. The one or more renewable energy supply sources 114 directly provides DC energy to the plurality of energy storage and supply means 106 without going through any voltage or current conversion process. In another embodiment of the present disclosure, the one or more renewable energy supply sources 114 is connected with the built environment 102 to supply available energy through the use of a direct current to alternating current inverter.

The plurality of energy storage and supply means 106 is configured to store the energy and supply to fulfil energy demand associated with the built environment 102. In an embodiment of the present disclosure, the plurality of energy storage and supply means 106 includes one or more battery cells assembled to create one or more battery packs capable of charging and discharging electric energy. In another embodiment of the present disclosure, the plurality of energy storage and supply means 106 is a high speed flywheel energy storage means. In yet another embodiment of the present disclosure, the plurality of energy storage and supply means 106 is pumped hydro energy storage means.

In yet another embodiment of the present disclosure, the plurality of energy storage and supply means 106 is nonelectrical energy storing mediums. In an example, the energy storage and supply means may be comprised of thermal mass or momentum, such that the calculated amount of energy as converted to heat is stored within the energy storage and supply means. In addition, the energy is stored and released at a certain rate using heat transfer or pumping as an energy transfer medium. In another example, a building environment, its construction, envelope and contents are utilized as a means to store, transfer and release energy passively or actively in a form of heat when combined with a means of artificial heating and cooling.

In an embodiment of the present disclosure, the plurality of energy storage and supply means 106 is located at a central location in the built environment 102. The central location associated with the built environment 102 include an electrical room or closet, exterior in a specialized storage cabinet or container and the like. In another embodiment of the present disclosure, the plurality of energy storage and supply means 106 is co-located with each of the plurality of energy consuming devices 104. In yet another embodiment of the present disclosure, the plurality of energy storage and supply means 106 is distributed throughout the built environment 102. In an example, the plurality of energy storage and supply means 106 is distributed in stand-alone forms, plug-in forms and design oriented forms such as furniture or permanent wall hanging forms or picture frames.

In yet another embodiment of the present disclosure, the plurality of energy storage and supply means 106 is built into the building structure or building electrical distribution itself. In yet another embodiment of the present disclosure, the plurality of energy storage and supply means 106 is in a form of thermal heat mass capture and release using calculated capacities of building materials. In yet another embodiment of the present disclosure, the plurality of energy storage and supply means is located outside of the built environment 102 in a micro-grid or fractal grid application.

Going further, the built environment 102 is associated with a plurality of users 128 present inside the built environment 102. The plurality of users 128 may be any human operator, human worker, occupants, data manager, visitors and the like. Each of the plurality of users 128 is associated with a task. For example, the human operators perform the task of monitoring and regulating machines. In another example, the human workers perform the task of cleaning, sweeping and repairing. In yet another example, the occupants are the employees that include managers, attendants, assistants, clerk, security staff and the like. In yet another example, the occupants are visitors present for a specific period of time.

Each of the plurality of users 128 utilizes a pre-defined amount of the energy. The pre-defined amount of the energy pertains to a corresponding energy consuming device of the plurality of energy consuming devices 104. Moreover, each of the plurality of energy consuming devices 104 performs an operation to meet requirements of the plurality of operations associated with the built environment 102. The plurality of operations is associated with the operation of each of the plurality of energy consuming devices 104 installed in the built environment 102. The plurality of energy consuming devices 104 may be of any type and size. In addition, the plurality of energy consuming devices 104 includes a plurality of electrical devices and a plurality of portable communication devices.

In an embodiment of the present disclosure, the plurality of energy consuming devices 104 may have any electrical and mechanical applications. Examples of the plurality of energy consuming devices 104 include but may not be limited to lighting circuits, refrigeration units, air conditioning systems, information technology networks, gas boilers, hot water heater, escalators, and elevators. The plurality of energy consuming devices 104 consumes a pre-defined amount of the energy based on a power rating, duration of energy usage and the plurality of operations performed. The pre-defined amount of the energy consumed by the plurality of energy consuming devices 104 is based on one or more energy physical variables. The one or more energy physical variables include but may not be limited to a power factor, a phase angle, a power frequency, a voltage, a current load and a power demand.

The one or more energy physical variables of each of the plurality of energy consuming devices 104 is monitored and measured by a plurality of energy metering devices. Each of the plurality of energy consuming devices 104 is combined with the plurality of energy metering devices. In an embodiment of the present disclosure, the plurality of energy metering devices is installed inside each of the plurality of energy consuming devices 104. The plurality of energy metering devices measures each of the one or more energy physical variables in real time. The plurality of energy metering devices include but may not be limited to digital multi-meters, current sensors and wattage meters. In addition, the plurality of energy metering devices facilitates collection of a first set of statistical data associated with the plurality of energy consuming devices 104.

The collection of the first set of statistical data uses a method. In an embodiment of the present disclosure, the method involves digital collection of the first set of statistical data for each of the plurality of energy consuming devices 104. In another embodiment of the present disclosure, the method involves physical collection of the first set of statistical data for each of the plurality of energy consuming devices 104. The plurality of energy metering devices monitors a first plurality of parameters. The first plurality of parameters is associated with the plurality of energy consuming devices 104. The first plurality of parameters includes a set of operational characteristics and a set of physical characteristics. The set of operational characteristics include a current rating, a voltage rating, a power rating, a frequency of operation, an operating temperature and a device temperature. In addition, the set of operational characteristics include a duration of the energy usage by each of the plurality of energy consuming devices 104 in the built environment 102. Moreover, the set of operational characteristics include a seasonal variation in operation and an off-seasonal variation in operation. Further, the set of physical characteristics include a device size, a device area, a device physical location and a portability of device. In an embodiment of the present disclosure, the one or more energy metering devices collects the first set of statistical data. In addition, the first set of statistical data includes a current operational state data and a past operational state data. The current operational state data and the past operational state data corresponds to current energy consumption data and the historical energy consumption data associated with the plurality of energy consuming devices 104 of the built environment 102.

Going further, the plurality of energy consuming devices 104 is associated with the plurality of users 128. The plurality of users 128 interacts with the plurality of energy consuming devices 104 installed in the built environment 102 to perform specific operations. The daily usage and the operating characteristics of the plurality of energy consuming devices 104 are derived from an interface associated with each user of the plurality of users 128. Each of the plurality of energy consuming devices 104 consumes a pre-defined amount of energy during the interface. The pre-defined amount of energy is derived based on an energy consumption behavior and an occupancy pattern of each of the plurality of users 128. In an example, each user of the plurality of users 128 in the built environment 102 may arrive and leave the built environment 102 during certain hours each day.

Further, the energy consumption behavior and the occupancy pattern is recorded for each of the plurality of users 128 to obtain a second set of statistical data. The energy consumption behavior and occupancy pattern is collected and recorded by a plurality of occupancy detection means. The plurality of occupancy detection means collect the energy consumption behavior and occupancy pattern associated with the plurality of users 128 in real time. The plurality of occupancy detection means are installed inside and outside of the built environment 102. The plurality of occupancy detection means include a plurality of occupancy sensing devices. The plurality of occupancy sensing devices include occupancy sensors, door state sensors, motion detectors, microphones and radio frequency identification (hereinafter as "RFID"). In addition, the plurality of occupancy sensing devices include radio received signal strength indicators (hereinafter as "RSSI") and digital or radio frequency signal processors. Furthermore, the plurality of occupancy detection means include the plurality of sensors 108. The plurality of sensors 108 include carbon-monoxide sensors, carbon-dioxide sensors, heat sensors, pressure sensors, atmospheric pressure sensors, temperature sensors, energy flow sensors, energy fingerprint sensors on monitored loads physical touch point sensors and the like.

The first set of statistical data and the second set of statistical data is transferred to the one or more data collecting devices 110 associated with the built environment 102. The one or more data collecting devices 110 collects the first set of statistical data and the second set of statistical data. The one or more data collecting devices 110 perform digital collection and manual collection. In an embodiment of the present disclosure, each of the one or more data collecting devices 110 is a portable device with an inbuilt API. The inbuilt API of each of the one or more data collection devices 110 is associated with a Global Positioning system (hereafter "GPS"). Further, the inbuilt API of each of the one or more data collection devices 110 is associated with a camera and keypad designed for manual data input from the plurality of users 128. In another embodiment of the present disclosure, each of the one or more data collecting devices 110 is a cellular modem. In yet another embodiment of the present disclosure, each of the one or more data collecting devices 110 is any suitable data gateway device.

The one or more data collecting devices 110 collects a third set of statistical data associated with each of the plurality of energy storage and supply means 106. In an embodiment of the present disclosure, the one or more data collecting devices 110 receives the third set of statistical data from the plurality of energy monitoring devices associated with each of the plurality of energy storage and supply means 106. The plurality of energy monitoring devices monitor a second plurality of parameters associated with the plurality of energy storage and supply means 106. In addition, the plurality of energy monitoring devices collect and transfer the second plurality of parameters associated with the plurality of energy storage and supply means 106 to the one or more data collecting devices 110 in real time. The second plurality of parameters include but may not be limited to charging and discharging rates, temperature characteristics, an energy storage and release capacity associated with the plurality of energy storage.

The one or more data collecting devices 110 is associated with the communication network 116 through an internet connection. The internet connection is established based on a type of network. In an embodiment of the present disclosure, the type of network is a wireless mobile network. In another embodiment of the present disclosure, the type of network is a wired network with a finite bandwidth. In yet another embodiment of the present disclosure, the type of network is a combination of the wireless and the wired network for the optimum throughput of data transmission. The communication network 116 includes a set of channels with each channel of the set of channels supporting a finite bandwidth. The finite bandwidth of each channel of the set of channels is based on a capacity of the communication network 116. The communication network 116 transmits a pre-defined size of the first set of statistical data, the second set of statistical data and the third set of statistical data to the energy demand control system 122. The pre-defined size corresponding to the first set of statistical data, the second set of statistical data and the third set of statistical data is measured in terms of at least one of bits, bytes, kilobytes, megabytes, gigabytes, terabytes and petabytes. Accordingly, the energy demand control system 122 receives the pre-defined size of the first set of statistical data, the second set of statistical data and the third set of statistical data. In addition, the energy demand control system 122 receives another part of the first set of statistical data, the second set of statistical data and the third set of statistical data from the plurality of external APIs 124 and third party databases.

Continuing with FIG. 1, the energy demand control system 122 receives a fourth set of statistical data and a fifth set of statistical data. The energy demand control system 122 receives the fourth set of statistical data from the plurality of environmental sensors 118 through the communication network 116. The plurality of environmental sensors 118 detect and collect environmental and weather conditions associated with the built environment 102 in real time. In addition, the plurality of environmental sensors 118 transfer the environmental and weather conditions to the energy demand control system 122 in real time. In an embodiment of the present disclosure, the plurality of environmental sensors 118 is present inside the built environment 102. In another embodiment of the present disclosure, the plurality of environmental sensors 118 is present outside the built environment 102. Further, the energy demand control system 122 receives the fifth set of statistical data from the plurality of energy pricing models 120. The plurality of energy pricing models 120 is configured to record energy prices associated with the built environment 102.

The energy demand control system 122 receives another part of the fourth set of statistical data and the fifth set of statistical data from the plurality of external APIs 124 and third party databases. The plurality of external APIs 124 and the third party databases are configured to collect, store and transmit weather history and weather forecasts. In addition, the plurality of external APIs 124 and the third party databases are configured to collect, store and transmit billing data, a past energy consumption data and metered energy data. Furthermore, the plurality of external APIs 124 and the third party databases are configured to collect, store and transmit financial or non-financial business data. The financial or non-financial business data comes from business management software. Example of the business management software includes Enterprise Resources Planning (ERP) software.

The energy demand control system 122 analyzes the first set of statistical data, the second set of statistical data, the third set of statistical data, the fourth set of statistical data and the fifth set of statistical data. The analysis is done by performing one or more statistical functions (discussed below in detailed description of FIG. 2). The energy demand control system 122 performs the one or more statistical functions to generate a plurality of statistical results. The plurality of statistical results pertains to the energy consumption (discussed below in detailed description of FIG. 2). The plurality of statistical results obtained from the analysis is used as a reference basis of the energy consumption to execute the one or more control routines for controlling peak loading conditions. The one or more control routines are executed by performing at least one of a plurality of control techniques (as explained in the detailed description of FIG. 2). In addition, the plurality of statistical results obtained from the analysis is used to manipulate an optimized operating state of energy consuming devices to efficiently reduce the time-variant energy demand and consumption of the built environment 102.

Further, the energy demand control system 122 displays each of the plurality of statistical results through an application installed in a mobile phone, tablet, smart watch and the like. In another embodiment of the present disclosure, the energy demand control system 122 displays each of the plurality of statistical results on a web page. In yet another embodiment of the present disclosure, the energy demand control system 122 displays each of the plurality of statistical results on a plurality of monitors. Furthermore, the energy demand control system 122 manipulates the optimized operating state of each of the plurality of energy consuming devices. The energy demand control system 122 performs manipulation to generate a peak level of energy demand concentrated over a limited period of time. Further, the energy demand control system 122 integrates the plurality of energy storage and supply means for providing an equivalent real time energy supply to selected energy consuming devices (as discussed in detailed description of FIG. 2).

Further, the energy demand control system 122 transfers the plurality of statistical results along with the one or more control routines to the one or more statistical monitoring devices 126. The one or more statistical monitoring devices 126 is configured to receive and display at least one of the first set of statistical data, the second set of statistical data, the third set of statistical data, the fourth set of statistical data and the fifth set of statistical data. In addition, the one or more statistical monitoring devices 126 are configured to receive and display at least one of the plurality of statistical results and the one or more control routines for proper monitoring and regulation. The one or more statistical monitoring devices 126 is a device capable of receiving the first set of statistical data, the second set of statistical data, the third set of statistical data, the fourth set of statistical data and the fifth set of statistical data from the energy demand control system 122. Also, the one or more statistical monitoring devices 126 is a device capable of receiving the plurality of statistical results and the one or more control routines from the energy demand control system 122.

It may be noted that in FIG. 1, the energy demand control system 122 transfers the first set of statistical data, the second set of statistical data, the third set of statistical data, the fourth set of statistical data, the fifth set of statistical data, the plurality of statistical results and the one or more control routines to the one or more statistical monitoring devices 126; however, those skilled in the art would appreciate that the energy demand control system 122 transfers the first set of statistical data, the second set of statistical data, the third set of statistical data, the fourth set of statistical data and the fifth set of statistical data, the plurality of statistical results and the one or more control routines to more number of statistical monitoring devices. Furthermore, it may be noted that in FIG. 1, the built environment 102 is connected to the energy demand control system 122 through the communication network 116; however, those skilled in the art would appreciate that more number of built environments are connected to the energy demand control system 122 through the communication network 116.

FIG. 2 illustrates a block diagram 200 for manipulating the load curves corresponding to the time-variant energy demand and consumption of the built environment 102, in accordance with various embodiments of the present disclosure. It may be noted that to explain the system elements of FIG. 2, references will be made to the system elements of the FIG. 1.

The block diagram 200 includes the built environment 102, commercial power supply grid node 112, the one or more renewable energy supply sources 114, the energy demand control system 122 and the plurality of external APIs 124 (as discussed above in detailed description of FIG. 1). In addition, the block diagram 200 includes the plurality of environmental sensors 118 and the plurality of energy pricing models 120 and the one or more statistical monitoring devices 126 (as discussed above in detailed description of FIG. 1). Moreover, the block diagram 200 includes a network based automatic control system 202 and third party databases 206. Furthermore, the energy demand control system 122 includes a server 204. In addition, the server 204 includes a database 204*a* and a processor 204*b*.

Each of the plurality of energy consuming devices 104 is associated with one or more energy physical variables (as described above in detailed description of FIG. 1). The one or more energy physical variables defines the energy consumption in the real time based on the load. In an embodiment of the present disclosure, each of the plurality of energy consuming devices 104 is associated with the plurality of energy metering devices. The plurality of energy metering devices digitally measures one or more energy physical variables in the real time to obtain the first set of statistical data (as discussed above in detailed description of FIG. 1). The plurality of energy metering devices includes one or more digital meters, one or more digital current and voltage sensors, the multi-meters, watt-meters, supervisory control and data acquisition (SCADA) and the like.

The energy demand control system 122 collects the first set of statistical data associated with the plurality of energy consuming devices 104 from the plurality of energy metering devices. The first set of statistical data includes a current operational state data associated with the plurality of energy consuming devices 104 and a past operational state data associated with the plurality of energy consuming devices 104. The operational state data is associated with the pre-defined amount of energy consume by each of the plurality of energy consuming devices 104 in real time. The plurality of energy consuming devices 104 consume the pre-defined amount of energy to perform a specific operation (as discussed above in detailed description of FIG. 1).

Further, the energy demand control system 122 fetches the second set of statistical data associated with an occupancy behavior of the plurality of users 128 present inside each of the built environment 102. The energy demand control system 122 fetches the second set of statistical data from the plurality of occupancy detection means. The second set of statistical data includes a first plurality of occupancy data and a second plurality of occupancy data. The first plurality of occupancy data is associated with energy consumption behavior of each of the plurality of users 128 present inside the built environment 102. The second plurality of occupancy data is associated with the occupancy pattern of each of the plurality of users 128 present inside the built environment 102.

The first plurality of occupancy data is associated with interaction between the plurality of energy consuming devices 104 and the plurality of users 128. In an example, a person X check-in to a hotel A. The person X uses the elevator to go upstairs, unlock the room by digital card swap and turns on the lighting and air conditioning unit. The interaction of the person X with the elevator, the digital card swaps door, the lightings and the air conditioning unit results in the pre-defined load consumption. The plurality of users 128 consumes the pre-defined amount of energy associated with the built environment 102. The second plurality of occupancy data is associated with the occupancy pattern of the plurality of users 128. The occupancy pattern of the plurality of users 128 varies with time, location, weather, season and the like. The occupancy pattern of the plurality of users 128 varies with different zones of the built environment 102. In an example, the occupancy pattern of the plurality of users 128 in shopping malls increases during the festive seasons. In another example, the occupancy pattern at the rugby ground increases during the match day.

The energy consumption behavior and occupancy pattern is recorded and counted by the plurality of occupancy detection means to obtain the second set of statistical data (as described above in detailed description of FIG. 1). In addition, the plurality of occupancy detection means record and count based on the one or more specifications. The one or more specifications include heat signature, identification cards, Bluetooth and the like. In an example, the record of first time visitors and frequent visitors is maintained for faster collection of the second set of statistical data. Further, the energy usage pattern of each of the plurality of users 128 creates a unique and aggregated consumption of the energy. The unique and aggregated consumption of the energy is based on a variation in number of the plurality of users 128. The variation in the number of the plurality of users 128 may be based on days, months, seasons, events and time of year. In addition, the variation in the number of the plurality of users 128 may be based on architectural configurations of the built environment 102. In an example, the occupancy pattern of the plurality of users 128 in shopping malls increases during the festive seasons. In another example, the occupancy pattern at the soccer ground increases during the match day.

Further, the energy demand control system 122 accumulates the third set of statistical data associated with each of the plurality of energy storage and supply means 106 from the plurality of energy monitoring devices. The third set of statistical data includes a current and historical energy storage and supply capacity data associated with the plurality of energy storage and supply means 106. The plurality of energy monitoring devices record and collect energy storage and supply capacity data associated with the plurality of energy storage and supply means 106 to obtain the third set of statistical data. The energy demand control system 122 accumulates the third set of statistical data based on the second plurality of parameters (as mentioned above in detailed description of FIG. 1).

The energy demand control system 122 receives the fourth set of statistical data from the plurality of environmental sensors 118 associated with the built environment 102 (discussed above in detailed description of FIG. 1). In addition, the energy demand control system 122 receives the fourth set of statistical data from the plurality of external APIs 124 and the third party databases 206. The fourth set of statistical data includes the current and historical environmental condition data of at least one of inside and outside of the built environment 102. The fourth set of statistical data is received by the energy demand control system 122 based on a third plurality of parameters. In an embodiment of the present disclosure, the third plurality of parameters include but may not be limited to a means of recording environmental data having temperature, humidity and air pressure associated with each of the plurality of environmental sensors.

Further, the energy demand control system 122 gathers the fifth set of statistical data from the plurality of energy pricing models 120. The fifth set of statistical data includes current and historical recordings of energy pricing state affecting the built environment 102. The plurality of energy pricing models 120 record and transfer the energy pricing to the energy demand control system 122 in real time through the communication network 116. In addition, the energy demand control system 122 gathers the fifth set of statistical data from the plurality of external APIs 124 and the third party databases 206 (as discussed above in detailed description of FIG. 1). The fifth set of statistical data is gathered based on a fourth plurality of parameters. In an embodiment of the present disclosure, the fourth plurality of parameters include a means of recording energy pricing data having an energy pricing model, an energy price signal associated with the built environment 102.

Going further, the energy demand control system 122 performs the analysis of the first set of statistical data, the second set of statistical data, the third set of statistical data, the fourth set of statistical data and the fifth set of statistical data. The energy demand control system 122 performs the one or more statistical functions to generate the plurality of statistical results. The one or more statistical functions include translating the current operational state data and the past operational state data associated with the plurality of energy consuming devices 104 into energy demand values. In addition, the one or more statistical functions include parsing the first set of statistical data, the second set of statistical data and the third set of statistical data. The energy demand control system 122 develops an energy usage profile. The energy demand control system 122 develops the energy usage profile of each of the plurality of energy consuming devices 104, each of the plurality of energy storage and supply means 106 and each of the plurality of users 128. In addition, the energy demand control system 122 develops the energy usage profile associated with each zone, groups of zones, such as each floor of a building and each of the one or more built environments.

Further, the one or more statistical functions include auto-fulfilling one or more data entries in the first set of statistical data, the second set of statistical data and the third set of statistical data. The auto-fulfilling of the one or more data entries is performed to minimize errors in deriving the energy consumption and demand associated with the built environment 102 for a given time interval. Moreover, the energy demand control system 122 auto-fulfils the one or more data entries by using an application of at least one of the statistical regression, interpolation and extrapolation.

The one or more statistical functions include comparing the current operational state data with the past operational state data. The energy demand control system 122 compares the current operational state data with the past operational state data associated with the each of the plurality of energy consuming devices 104. The current operational state data and the past operational state data are compared to determine the potential for improvement in energy consumption of each of the plurality of energy consuming devices 104. In addition, the energy demand control system 122 compares a current energy storage capacity and a past energy storage capacity associated with each of the plurality of energy storage and supply means 106. The current energy storage capacity and the past energy storage capacity are compared to determine the potential for improvement in charge/discharge cycles and energy storage capacity of each of the plurality of energy storage and supply means 106.

Accordingly, the analysis of the first set of statistical data, the second set of statistical data, the third set of statistical data, the fourth set of statistical data and the fifth set of statistical data provides the plurality of statistical results. The plurality of statistical results pertains to the energy consumption. In addition, the plurality of statistical results is based on a statistical data model. The statistical data model provides a complete insight into the energy consumption trend. The plurality of statistical results includes one or more graphs, one or more charts, one or more tables and one or more statistical maps of energy consumption. The plurality of statistical results is obtained as a function of duration of the operations of the plurality of energy consuming devices and energy storage and supply capacity of the plurality of energy storage and supply means. In addition, the plurality of statistical results is obtained as a function of environmental conditions, and energy pricing affecting the built environment 102.

In an example, the plurality of statistical results include a table and chart of monthly energy consumption of the built environment 102 and a table of a total monthly variable energy load. In another example, the plurality of statistical results includes a pie chart to show a separation of the energy use in the built environment 102 and a table of energy consumption per month associated with air conditioning loads. In yet another example, the plurality of statistical results includes a statistical chart depicting a kWh consumption based on load type, a bar graph of expected air conditioner savings and service costs. In yet another example, the plurality of statistical results include a bar chart of gross rental, service and licensing costs of at least one of air conditioning units, air conditioning control means, statistical software and networks. In yet another example, the plurality of statistical results includes the statistical chart of total kWh consumed per room as a function of cold degree days.

The energy demand control system 122 executes the one or more control routines for controlling the peak loading conditions associated with the built environment 102. The energy demand control system 122 executes the one or more control routines based on the plurality of statistical results corresponding to the energy demand and consumption of the built environment 102. In an embodiment, the energy demand control system 122 executes the one or more control routines through the network based automatic control system 202. The network based automatic control system 202 is associated with the built environment 102. In addition, the network based automatic control system 202 is associated with a plurality of electrical control relays. In addition, the network based automatic control system 202 is associated with a microprocessor based switches. The network based automatic control system 202 sends one or more control signals based on the one or more control routines. The network based automatic control system 202 automatically applies the one or more control routines to the built environment 102.

The network based automatic control system 202 controls the operation of each of the plurality of energy consuming devices 104. In addition, the network based automatic control system 202 controls the plurality of energy consuming devices 104 based on the occupancy behavior of the plurality of users 128 and energy storage capacity of the plurality of energy storage and supply means 106. Moreover, the network based automatic control system 202 controls the plurality of energy consuming devices 104 based on weather conditions and real time energy pricing associated with the built environment 102. Furthermore, the network based automatic control system 202 controls the plurality of energy storage and supply means 106 based on the real time energy demand, weather conditions and forecasts, and real time energy pricing associated with the built environment 102.

The energy demand control system 122 executes the one or more control routines by performing at least one of the plurality of control techniques. The energy demand control system 122 performs the plurality of control techniques for generating an optimized time-variant energy demand associated with the built environment 102. In addition, the energy demand control system 122 performs the plurality if control techniques for rendering one or more gradual load curves associated with the built environment 102. The one or more gradual load curves corresponds to the optimized time-variant energy demand and consumption associated with the built environment 102. The plurality of control techniques include at least one of a waveform analysis based control technique, a key performance indicator based control technique, a prioritization based control technique and an efficiency based control technique.

The energy demand control system 122 performs at least one of the plurality of control techniques to control the peak loading conditions associated with the built environment 102. In addition, the energy demand control system 122 executes each technique of the plurality of techniques in a pre-defined sequence to establish a pre-defined control level. In an embodiment of the present disclosure, the energy demand control system 122 executes the waveform analysis based control technique to establish a first control level. The waveform analysis based control technique is performed by analyzing operating state of the plurality of energy consuming devices 104. The operating state of the plurality of energy consuming devices is analyzed in real time for regulating the operating states of each of the plurality of energy consuming devices 104 in time series. The operating states of each of the plurality of energy consuming devices 104 is regulated so that the minimum possible number of load states gets overlapped at the same given moment in time. In an example of a hotel building, multiple air conditioning compressors may be turning on and off to transfer energy and maintain a specific temperature inside the building environment. Multiplied by 100 times, these air conditioners may coincidentally oscillate on and off at the same time. The plurality of energy metering devices regularly collects and transmits the operating state of the air conditioning compressor as a value, on or off or zero to one hundred to the energy demand control system 122. The waveform and frequency of usage of each compressor is recorded for a pre-defined period of time. At a specific moment of time, the highest demand unit is operating at a frequency of 6 cycles per hour (the "frequency") or 3 minutes (the "amplitude") each 7 minutes. Also, the lowest demand unit is operating at a frequency of 3 cycles per hour or 3 minutes each 17 minutes at that specific moment of time. The energy demand control system 122 executes the waveform analysis based control technique by shifting each of the 100 air conditioning unit cycles forwards or backwards in time to achieve a minimum energy consumption at the specific moment of time. The energy demand control system 122 executes the waveform analysis based control technique in a closed loop to optimize the operating state of each of the plurality of energy consuming devices.

In an embodiment of the present disclosure, the energy demand control system 122 executes the waveform analysis based control technique followed by the key performance indicator based control technique to establish a second control level. The energy demand control system 122 identifies and assigns the key performance indicators to each of the plurality of energy consuming devices 104. The energy demand control system 122 identifies and assigns the key performance indicators based on the operating state of each of the plurality of energy consuming devices 104 over a period of time. Further, the energy demand control system 122 compares the key performance indicators of each of the plurality of energy consuming devices 104 and prioritize the control instructions. In an example, an energy consuming device X is operating at a relatively high frequency and amplitude than an energy consuming device Y for a given set of loads. The energy demand control system 122 assigns a relatively lower key performance indicator to the energy consuming device X as compared to the energy consuming device Y. Further, the energy demand control system 122 prioritize the control instructions for the energy consuming device Y over the control instructions for the energy consuming device X. In another example, a certain air conditioning compressor unit installed in room X may need to operate substantially more than others within an artificially cooled building due to the orientation and heat load from the sun. The energy demand control system 122 analyzes the current operating state, identify and compare the key performance indicator of the air conditioning compressor unit of room X with other air conditioning units. The energy demand control system 122 prioritize the air conditioning compressor installed in the room X over other air conditioning compressor units installed in the building. Further, the energy demand control unit 122 implement the waveform analysis control technique for other air conditioning units prior to the air conditioning compressor unit of room X.

In an embodiment of the present disclosure, the energy demand control system 122 executes the plurality of control techniques associated with the second control level followed by the prioritization based control technique to establish a third level control. The third control level is established by considering the second set of statistical data associated with the plurality of users 128 and the fourth set of statistical data associated with the environmental conditions. The second set of statistical data and the fourth set of statistical data are received by the energy demand control system 122. The energy demand control system 122 analyze the second set of statistical data and the fourth set of statistical data to generate a new set of key performance indicators with priority over a basic set associated with the second control level. The new set of key performance indicators are generated based on temperature, occupancy associated with the built environment and historical performance and efficiencies of each of the plurality of energy consuming devices. Further, the energy demand control system 122 prioritize one or more instructional control strategies based on the environmental conditions and occupancy. Moreover, the energy demand control system prioritize the instructional control strategies for each zone of the built environment 102. For example, in a hotel with many rooms and many air conditioning compressors, the energy demand control system 122 receives both the current operating state of the compressor for each room as well as the current temperature and occupancy. The energy demand control system 122 prioritize the control strategies for each room first by waveform characteristics (frequency and amplitude), then by current temperature for each room and finally by occupancy. The energy demand control system 122 provides a high level of manipulation priority to the rooms with unoccupied state. The energy demand control system 122 prioritize the instructional control strategies for the unoccupied rooms such that the frequency and amplitude of those unoccupied rooms gets lowered.

In an embodiment of the present disclosure, the energy demand control system 122 executes the plurality of control techniques associated with the third control level followed by the efficiency based control technique to establish a fourth control level. The energy demand control system 122 improves an actual operating efficiency by regulating the operating states of each of the plurality of energy consuming devices 104 in real time. The energy demand control system 122 prioritize the instructional control strategies to decrease the frequency of usage and increase the amplitude of the plurality of energy consuming devices 104. In an example, the energy demand control system 122 establish the third control level to optimize the operating state of the compressor with a 6 cycles per hour frequency and a 3 minutes amplitude. Further, the energy demand control system 122 regulates the operating state of compressor with the 6 cycles per hour frequency and the 3 minutes amplitude to 3 cycles per hour frequency and a 6 minutes amplitude. This increases the efficiency of the compressor units by reducing the number of cycles associated with each compressor units. In addition, an average energy consumption of 200 Watts per compressor per hour corresponding to the 6 cycles per hour frequency and 3 minutes amplitude is reduced to 180 Watts per compressor per hour corresponding to the 3 cycles per hour frequency and 6 minutes amplitude. The energy demand control system 122 continues to incrementally decrease the number of cycles to achieve the optimum energy consumption. For example, if the cycle frequency was further reduced to two, 9 minute cycles and the energy consumption increases from 180 Watts per compressor per hour to 190 Watts per hour, the energy demand control system 122 reverts the frequency or amplitude back to optimal value of three, 6 minutes cycles.

Continuing with FIG. 2, the one or more control routines are executed for optimizing the time variant energy demand and consumption associated with the built environment 102. In addition, the one or more control routines are executed for rendering the one or more gradual load curves associated with the built environment 102. In an embodiment of the present disclosure, the one or more gradual load curves are rendered in at least one of a gradually increasing shape, gradually decreasing shape and flat shape. The one or more gradual load curves corresponds to the optimized time-variant energy demand and consumption associated with the built environment 102. The optimized time-variant energy demand and consumption of the built environment 102 is further minimized by manipulating the optimized operating state of each of the plurality of energy consuming devices 104.

The energy demand control system 122 manipulates the optimized operating state of each of the plurality of energy consuming devices 104. The energy demand control system 122 manipulates the optimized operating state by time-variant shifting of energy usage of each selected energy consuming device of the plurality of energy consuming devices 104. The time-variant shifting of the energy usage is performed in a scheduled energy usage profile of the selected energy consuming device of the plurality of energy consuming devices 104. The energy demand control system 122 performs the time-variant shifting and scheduling to generate a peak level of energy demand concentrated over a limited period of time. In an embodiment of the present disclosure, the time-variant shifting of energy usage is performed by shifting the operating cycle of the selected energy consuming devices of the plurality of energy consuming devices 104 to at least one of forward and backward in real time. In addition, the energy demand control system 122 performs the time-variant shifting and scheduling to render one or more steep load curves associated with the built environment 102. The one or more steep load curves corresponds to the peak level of energy demand concentrated over a limited period of time.

Further, the energy demand control system 122 integrates the plurality of energy storage and supply means 106 to the built environment 102. The energy demand control system 122 integrates the plurality of energy storage and supply means for optimally reducing the peak level of energy demand concentrated over the limited period of time. The energy demand control system 122 monitors the manipulated operating state of each of the plurality of energy consuming devices 104, environmental conditions associated with the built environment and comfort level of each user of the plurality if users 128. In addition, the energy demand control system 122 derives a threshold level associated with the comfort level of the plurality of users, environmental conditions and energy consumption of the built environment 102. The energy demand control system 122 performs integration of the plurality of energy storage and supply means based on validation of an increase in the energy demand above the threshold level.

The energy demand control system 122 integrates the plurality of energy storage and supply means for providing the equivalent real time energy supply to the selected energy consuming devices from the plurality of energy storage and supply means. In addition, the integration is performed for optimally reducing the peak level of energy demand of the built environment 102 concentrated over the limited period of time. The optimal reduction of the peak level of energy demand provides at least one of a first potential for optimum charge and a second potential of optimum discharge of the plurality of energy storage and supply means over a period of time. The first potential for optimum charge and the second potential for optimum discharge results in a more effective demand reduction from the plurality of energy storage and supply means having low energy storage capacity.

The integration of the plurality of energy storage and supply means having low energy storage capacity includes a deeper potential for charge and discharge over a shorter period of time. In an example of a hotel, 100 air conditioning units are operating in a pre-defined operating cycles to maintain a consistent average indoor temperature range in accordance with the comfort design and demand of the guests. The energy demand control system 122 optimizes the energy demand by application of the first control level, the second control level, the third control level and the fourth control level. The energy demand control system 122 executes the one or more control routines to optimize the maximum concurrent demand from 100 air conditioning unit to 20 air conditioning units. The maximum concurrent demand is reduced while maintaining the consistent average indoor temperature range in accordance with the comfort design and demand of the buildings occupants. The energy demand control system 122 instructs all 20 air conditioning unit operating simultaneously to turn off resulting in a rapid rise in temperature inside the hotel. This renders a steep and hollow energy demand curve associated with the energy usage profile of the hotel. The energy demand control system 122 monitors a real time temperature rise within the hotel building and compares with the threshold level. The energy demand control system 122 prompts the 40 air conditioning units to turn on resulting in faster recovery to a previous indoor temperature range. Further, the energy demand control system 122 integrates the plurality of energy storage and supply means 106 to discharge and supply the equivalent real time energy to the additional 20 air conditioning units. The additional 20 air conditioning units utilizes the energy discharged from the plurality of energy storage and supply means 106. The energy consumption identical to the condition of only 20 air conditioning units operating for a given time interval is maintained. This would provide an effective energy demand reduction provided by the plurality of energy storage and supply means 106 equivalent to the demand generated by 20 air conditioning units. The energy demand control system 122 prompts the plurality of energy storage and supply means 106 to stop supplying the equivalent real time energy as soon as average temperature requirement is restored in the built environment 102. This results in a steep and short discharge intervals of the plurality of energy storage and supply means 106.

In another example, 20 air conditioning units is controlled for a given specific indoor temperature requirement, based on given outdoor weather conditions. The energy demand control system 122 alternate the operation of 10 air conditioning units in sequence with the charge and discharge cycles of the plurality of energy storage and supply means 106. This reduces the sinusoidal net average demand, while maintaining the average indoor temperature. The energy demand control system 122 prompts the 10 air conditioning units to turn off, leaving 10 air conditioning units operating at a specific time interval. In addition, the energy demand control system 122 prompts the plurality of energy storage and supply means 106 to start charging at a rate equivalent to the power consumption of 10 AC units such that the total net demand remains equivalent to 20 air conditioning units. This results in a steep and short charge intervals of the plurality of energy storage and supply means 106.

The energy demand control system 122 stores the first set of statistical data, the second set of statistical data, the third set of statistical data, the fourth set of statistical data and the fifth set of statistical data in the database 204a in real time. In addition, the energy demand control system 122 stores the plurality of statistical results and the key performance indicators in the database 204a in real time. Moreover, the energy demand control system 122 stores a log file having the one or more control routines in the database 204a in real time.

The energy demand control system 122 updates the first set of statistical data, the second set of statistical data, the third set of statistical data, the fourth set of statistical data and the fifth set of statistical data in real time. In addition, the energy demand control system 122 updates the plurality of statistical results and the key performance indicators in real time. Moreover, the energy demand control system 122 updates the log file having the one or more control routines in real time.

The energy demand control system 122 displays at least one of the first set of statistical data, the second set of statistical data, the third set of statistical data, the fourth set of statistical data and the fifth set of statistical data on the one or more statistical monitoring devices 126. In addition, the energy demand control system 122 displays at least one of the plurality of statistical results and the key performance indicators on the one or more statistical monitoring devices 126 in real time. Moreover, the energy demand control system 122 displays the log file having the one or more control routines in real time.

FIG. 3 illustrates a block diagram 300 of the energy demand control system 122, in accordance with various embodiment of the present disclosure. It may be noted that to explain the system elements of FIG. 3, references will be made to the system elements of the FIG. 1 and the FIG. 2. The energy demand control system 122 includes a collection module 302, a fetching module 304, an accumulation module 306, a reception module 308, a gathering module 310 and an analyzing module 312. In addition, the energy demand control system 122 includes an execution module 314, a manipulation module 316 and an integration module 318. Moreover, the energy demand control system 122 includes a storage module 320, an updating module 322 and a displaying module 324. The above mentioned modules are configured for manipulating the load curves corresponding to the time-variant energy demand and consumption of the built environment 102 associated with the one or more renewable energy supply sources.

The collection module 302 collects the first set of statistical data associated with each of the plurality of energy consuming devices 104 installed in the built environment 102. The first set of statistical data includes the current operational state data and the past operational state data associated with the plurality of energy consuming devices 104. The plurality of energy metering devices collects the first set of statistical data. The plurality of energy metering devices transfer the first set of statistical data to the one or more data collecting devices 110. The one or more data collecting devices 110 transfer the first set of statistical data to the energy demand control system 122 (as explained above in the detailed description of FIG. 1 and FIG. 2).

The fetching module 304 fetches the second set of statistical data associated with the occupancy behavior of the plurality of users 128 present inside the built environment 102. The second set of statistical data includes the energy consumption behavior of each of the plurality of users 128 present inside the built environment 102. In addition, the second set of statistical data includes the occupancy pattern of each of the plurality of users 128 present inside the built environment 102. The plurality of occupancy detection means and the plurality of sensors 108 fetches the second set of statistical data in real time. In addition, the plurality of occupancy detection means and the plurality of sensors 108 transfer the second set of statistical data to the energy demand control system 122 (as discussed above in detailed description of FIG. 1 and FIG. 2).

The accumulation module 306 accumulates the third set of statistical data associated with each of the plurality of energy storage and supply means 106 associated with the built environment 102. The third set of statistical data includes the current and historical energy storage and supply capacity data associated with the plurality of energy storage and supply means 106. The plurality of energy monitoring devices accumulates the energy storage and supply capacity data associated with each of the plurality of energy storage and supply means 106 in real time to obtain the third set of statistical data. In addition, the plurality of energy monitoring devices transfer the third set of statistical data to the energy demand control system 122 (as explained above in detailed description of FIG. 1 and FIG. 2).

The reception module 308 receives the fourth set of statistical data associated with each of the plurality of environmental sensors 118. The fourth set of statistical data includes the current and historical environmental condition data of at least one of inside and outside of the built environment 102. The plurality of environmental sensors 118 records the environmental condition data in real time to obtain the fourth set of statistical data. In addition, the plurality of environmental sensors 118 transfers the fourth set of statistical data to the energy demand control system 122. Moreover, the reception module 308 receives the fourth set of statistical data from the plurality of external APIs 124 and the third party databases 206 (as discussed above in detailed description of FIG. 1 and FIG. 2).

The gathering module 310 gathers the fifth set of statistical data associated with each of the plurality of energy pricing models 120. The fifth set of statistical data includes the current and historical recordings of the energy pricing state affecting the built environment 102. The plurality of energy pricing models 120 record the real time energy pricing state associated with the built environment 102 to obtain the fifth set of statistical data. In addition, the plurality of energy pricing models transfer the fifth set of statistical data to the energy demand control system 122. Moreover, the gathering module 310 gathers the fifth set of statistical data from the plurality of external APIs 124 and the third party databases 206 (as explained above in detailed description of FIG. 1 and FIG. 2).

The analyzing module 312 analyzes the first set of statistical data, the second set of statistical data, the third set of statistical data, the fourth set of statistical data and the fifth set of statistical data. The analyzing module 312 includes a translation module 312a, a parsing module 312b, an auto-fulfilling module 312c and a comparison module 312d. The translation module 312a translates the current operational state data and the past operational state data associated with the plurality of energy consuming devices 104 into the energy demand values. In addition, the translation module 312a translates the current operational state data and the past operational state data into the energy demand values for the pre-defined interval of time. The parsing module 312b parses the first set of statistical data, the second set of statistical data and the third set of statistical data. The parsing module 312b parses the first set of statistical data, the second set of statistical data and the third set of statistical data based on the physical location of each of the plurality of energy consuming devices 104. In addition, the parsing module 312b parses the first set of statistical data, the second set of statistical data and the third set of statistical data based on the occupancy pattern of the plurality of users 128. Moreover, the parsing module 213b parses the first set of statistical data, the second set of statistical data and the third set of statistical data based on the weather conditions and real time energy pricing state. The auto-fulfilling module 312c auto-fulfils the one or more data entries in the first set of statistical data, the second set of statistical data and the third set of statistical data. Furthermore, the comparison module 312d compares the current operational state data with the past operational state data associated with the each of the plurality of energy consuming devices 104. In addition, the comparison module 312d compares the current energy storage capacity and the past energy storage capacity associated with each of the plurality of energy storage and supply means 106 (as discussed above in detailed description of FIG. 2).

The analysis is performed to generate the plurality of statistical results associated with the energy consumption of the built environment 102 in real time. The plurality of statistical results includes one or more graphs, one or more charts, one or more tables and one or more statistical maps of the energy consumption as a function of duration of the operations. Further, the plurality of statistical results includes base-load, variable load, the cost of the operations, energy efficiency, the temperature, humidity and daylight. Furthermore, the plurality of statistical results includes the real time occupancy of the plurality of users 128 inside the built environment 102 and physical parameters of each of the plurality of energy consuming devices.

The execution module 314 executes the one or more control routines for controlling peak loading conditions associated with the built environment 102. The execution module 314 perform execution on the plurality of statistical results. The one or more control routines being executed by performing at least one of the plurality of control techniques. The execution module 314 performs the plurality of control techniques for generating the optimized time variant energy demand and consumption and rendering the one or more gradual load curves associated with the built environment 102. Moreover, the execution module 314 executes the one or more control routines through the network based automatic control system 202. The network based automatic control system 202 automatically applies the one or more control routines to the built environment 102 (as discussed in detailed description of FIG. 2).

The manipulation module 316 manipulates the optimized operating state of each of the plurality of energy consuming devices 104. The manipulation module 316 manipulates the optimized operating state by time-variant shifting of energy usage of each selected energy consuming device of the plurality of energy consuming devices 104. The time-variant shifting of the energy usage is performed in the scheduled energy usage profile of the selected energy consuming device of the plurality of energy consuming devices 104. The manipulation module 316 performs the time-variant shifting and scheduling to generate the peak level of energy demand concentrated over the limited period of time. Moreover, the manipulation module 316 manipulates the optimized operating state to render the one or more steep load curves associated with the peak level of energy demand of the built environment 102 (as explained in the detailed description of FIG. 2).

The integration module 318 integrates the plurality of energy storage and supply means for providing an equivalent real time energy supply to the selected energy consuming devices of the plurality of energy consuming devices 104. The integration module 318 integrates the plurality of energy storage and supply means based on validation of the increase in the energy demand above the threshold level. The integration module 318 performs integration for optimally reducing the peak level of energy demand concentrated over the limited period of time (as explained in the detailed description of FIG. 2).

The storage module 320 stores the first set of statistical data, the second set of statistical data, the third set of statistical data, the fourth set of statistical data and the fifth set of statistical data in the database 204a in real time. In addition, the storage module 320 stores the plurality of statistical results and the key performance indicators in the database 204a in real time. Moreover, the storing 320 stores the log file having the one or more control routines in the database 204a in real time. The database 204a is associated with the server 204 of the energy demand control system 122.

The updating module 322 updates the first set of statistical data, the second set of statistical data, the third set of statistical data, the fourth set of statistical data and the fifth set of statistical data in real time. In addition, the updating module 322 updates the plurality of statistical results and the key performance indicators in real time. Moreover, the updating module 322 updates the log file having the one or more control routines in real time.

The displaying module 324 displays the first set of statistical data, the second set of statistical data, the third set of statistical data, the fourth set of statistical data and the fifth set of statistical data on the one or more statistical monitoring devices 126. In addition, the displaying module 324 displays the plurality of statistical results and the key performance indicators on the one or more statistical monitoring devices 126 in real time. Moreover, the displaying module 324 displays the log file having the one or more control routines in real time.

FIG. 4 illustrates a flow chart 400 for manipulating the load curves corresponding to the time-variant energy demand and consumption of the built environment, in accordance with various embodiments of the present disclosure. It may be noted that to explain the process steps of flowchart 400, references will be made to the system elements of FIG. 1, FIG. 2 and FIG. 3. It may also be noted that the flowchart 400 may have lesser or more number of steps.

The flowchart 400 initiates at step 402. Following step 402, at step 404, the analyzing module 312 analyzes the first set of statistical data, the second set of statistical data, the third set of statistical data, the fourth set of statistical data and the fifth set of statistical data by performing the one or more statistical functions. The analyzing module 312 analyze to obtain the plurality of statistical results. Further at step 406, the execution module 314 executes the one or more control routines. The one or more control routines are executed for generating the optimized time variant energy demand and consumption and rendering the one or more gradual load curves associated with the built environment 102. Further, at step 408, the manipulation module 316 manipulates the optimized operating state of each of the plurality of energy consuming devices 104. The manipulation module 316 manipulates to generate the peak level of energy demand concentrated over the limited period of time and rendering the one or more steep load curves associated with the built environment 102. At step 410, the integration module 318 integrates the plurality of energy storage and supply means 106. The plurality of energy storage and supply means 106 is integrated for providing the equivalent real time energy supply to the selected energy consuming devices. The flow chart 400 terminates at step 412.

FIG. 5 illustrates a block diagram of a computing device 500, in accordance with various embodiments of the present disclosure. The computing device 500 includes a bus 502 that directly or indirectly couples the following devices: memory 504, one or more processors 506, one or more presentation components 508, one or more input/output (I/O) ports 510, one or more input/output components 512, and an illustrative power supply 514. The bus 502 represents what may be one or more busses (such as an address bus, data bus, or combination thereof). Although the various blocks of FIG. 5 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventors recognize that such is the nature of the art, and reiterate that the diagram of FIG. 5 is merely illustrative of an exemplary computing device 500 that can be used in connection with one or more embodiments of the present invention. Distinction is not made between such categories as "workstation," "server," "laptop," "hand-held device," etc., as all are contemplated within the scope of FIG. 5 and reference to "computing device." The computing device 500 typically includes a variety of computer-readable media. The computer-readable media can be any available media that can be accessed by the computing device 500 and includes both volatile and nonvolatile media, removable and non-removable media. By way of example, and not limitation, the computer-readable media may comprise computer storage media and communication media. The computer storage media includes volatile and nonvolatile, removable and non-removable media implemented in any method or technology for storage of information such as computer-readable instructions, data structures, program modules or other data. The computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 500. The communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 504 includes computer-storage media in the form of volatile and/or nonvolatile memory. The memory 504 may be removable, non-removable, or a combination thereof. Exemplary hardware devices include solid-state memory, hard drives, optical-disc drives, etc. The computing device 500 includes one or more processors that read data from various entities such as memory 504 or I/O components 512. The one or more presentation components 508 present data indications to a user or other device. Exemplary presentation components include a display device, speaker, printing component, vibrating component, etc. The one or more I/O ports 510 allow the computing device 500 to be logically coupled to other devices including the one or more I/O components 512, some of which may be built in. Illustrative components include a microphone, joystick, game pad, satellite dish, scanner, printer, wireless device, etc.

The present disclosure has many advantages over the existing art. The present disclosure provides technical advantages, economic advantages as well as ancillary benefits. The present disclosure enables the utilization of the energy storage and supply means having relatively smaller size and energy storage capacity for addressing the same time-variant load reduction requirements. In addition, the present disclosure controls a large amount of energy loads or demands and cost associated with the installation and operations. Moreover, the present disclosure provides a stable grid network resulting in stable energy pricing and removing volatility of current power system designs.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is understood that various omissions and substitutions of equivalents are contemplated as circumstance may suggest or render expedient, but such are intended to cover the application or implementation without departing from the spirit or scope of the claims of the present technology.

While several possible embodiments of the invention have been described above and illustrated in some cases, it should be interpreted and understood as to have been presented only by way of illustration and example, but not by limitation. Thus, the breadth and scope of a preferred embodiment should not be limited by any of the above-described exemplary embodiments.

What is claimed is:

1. A computer-implemented method for manipulating load curves corresponding to time-variant energy demand and consumption of a built environment associated with one or more renewable energy sources, the computer-implemented method comprising:

analyzing, at an energy demand control system with a processor, a first set of statistical data associated with a plurality of energy consuming devices, a second set of statistical data associated with an occupancy behavior of a plurality of users, a third set of statistical data associated with a plurality of energy storage and supply means, a fourth set of statistical data associated with a plurality of environmental sensors and a fifth set of statistical data associated with a plurality of energy pricing models and wherein the analyzing being done by performing one or more statistical functions to generate a plurality of statistical results;

executing, at the energy demand control system with the processor, one or more control routines for controlling peak loading conditions associated with the built environment, wherein the execution being performed based on the plurality of statistical results, wherein the one or more control routines being executed by performing at least one of a plurality of control techniques and wherein the plurality of control techniques being performed for generating an optimized time variant energy demand and consumption and rendering one or more gradual load curves associated with the built environment;

manipulating, at the energy demand control system with the processor, an optimized operating state of each of the plurality of energy consuming devices, wherein the operating state of the plurality of energy consuming devices being manipulated by time-variant shifting of energy usage of each selected energy consuming device of the plurality of energy consuming devices in a scheduled energy usage profile of the selected energy consuming device of the plurality of energy consuming devices, wherein the time-variant shifting and scheduling being performed for generating a peak level of energy demand concentrated over a limited period of time and rendering one or more steep load curves associated with the built environment;

integrating, at the energy demand control system with the processor, the plurality of energy storage and supply means for providing an equivalent real time energy supply to selected energy consuming devices of the plurality of energy consuming devices, wherein the integration being performed based on validation of an increase in the energy demand above a threshold level, wherein the integration being performed for optimally reducing the peak level of energy demand concentrated over the limited period of time and wherein the optimal reduction of the peak level of energy demand provides at least one of a first potential for optimum charge and a second potential of optimum discharge of the plurality of energy storage and supply means over a period of time.

2. The computer-implemented method of claim 1, wherein the plurality of control techniques comprises a waveform analysis based control technique, a key performance indicator based control technique, a prioritization based control technique and an efficiency based control technique.

3. The computer-implemented method of claim 1, wherein the analyzing, the executing, the manipulating and the integrating being performed in a continuous closed loop with feedback loop for optimizing the time-variant energy demand and consumption associated with each built environment of the one or more built environments.

4. The computer-implemented method of claim 1, wherein the plurality of energy storage and supply means comprises at least one of a battery storage, a flywheel energy storage, pumped liquid system and built environment capable of storing, transferring and releasing thermal energy.

5. The computer-implemented method of claim 1, further comprising collecting, at the energy demand control system with the processor, the first set of statistical data associated with the plurality of energy consuming devices, wherein the first set of statistical data comprises a current operational state data and a past operational state data associated with each of the plurality of energy consuming devices, wherein the first set of statistical data being collected based on a first plurality of parameters, wherein the first plurality of parameters comprises a set of operational characteristics and a set of physical characteristics associated with each of the plurality of energy consuming devices, wherein the set of operational characteristics comprises a current rating, a voltage rating, a power rating, a frequency of operation, an operating temperature, a device temperature, the duration of operation, a seasonal variation in operation and off-seasonal variation in operation and wherein the set of physical characteristics comprises a device size, a device area, a device physical location and a portability of device and wherein the first set of statistical data being collected in real time.

6. The computer-implemented method of claim 1, further comprising fetching, at the energy demand control system with the processor, the second set of statistical data associated with the occupancy behavior of the plurality of users present inside each of the one or more built environments, wherein the second set of statistical data comprises a first plurality of occupancy data and a second plurality of occupancy data, wherein the first plurality of occupancy data being associated with energy consumption behavior of each user of the plurality of users present inside the one or more built environments and the second plurality of occupancy data being associated with an occupancy pattern of each user of the plurality of users present inside the one or more built environments.

7. The computer-implemented method of claim 1, further comprising accumulating, at the energy demand control system with the processor, the third set of statistical data associated with each of the plurality of energy storage and supply means, wherein the third set of statistical data comprises a current and historical energy storage and supply capacity data associated with the plurality of energy storage and supply means, wherein the accumulation of the third set of statistical data being performed based on a third plurality of parameters, wherein the third plurality of parameters comprises charging and discharging rates, temperature characteristics, an energy storage and release capacity, charge current, charge level, discharge current, idle time and depth of discharge associated with the plurality of energy storage and supply means and wherein the third set of statistical data being accumulated in real time.

8. The computer-implemented method of claim 1, further comprising receiving, at the energy demand control system with the processor, the fourth set of statistical data associated with each of the plurality of environmental sensors, wherein the fourth set of statistical data comprises a current and historical environmental condition data of at least inside and outside the one or more built environments, wherein the reception of the fourth set of statistical data being performed based on a fourth plurality of parameters, wherein the fourth plurality of parameters comprises a means of recording environmental data comprising temperature, humidity and air pressure associated with each of the plurality of environmental sensors present inside or outside the one or more built environments and wherein the environmental data being obtained from a plurality of external application programming interfaces and a plurality of third party databases and wherein the fourth set of statistical data being received in real time.

9. The computer-implemented method of claim 1, further comprising gathering, at the energy demand control system with the processor, the fifth set of statistical data associated with each of the plurality of energy pricing models, wherein the fifth set of statistical data comprises current and historical recordings of energy pricing state affecting the one or more built environments, wherein the gathering of the fifth set of statistical data being done based on a fifth plurality of parameters, wherein the fifth plurality of parameters comprises a means of recording energy pricing data including an energy pricing model or an energy price signal associated with the one or more built environments and wherein the energy pricing data being obtained from a plurality of external application programming interfaces and a plurality of third party databases and wherein the fifth set of statistical data being gathered in real time.

10. The computer-implemented method of claim 1, wherein the one or more statistical functions comprises:

translating current operational state data and past operational state data associated with the plurality of energy consuming devices into energy demand values for a pre-defined interval of time;

parsing the first set of statistical data, the second set of statistical data and the third set of statistical data;

auto-fulfilling one or more data entries in the first set of statistical data, the second set of statistical data and the third set of statistical data based on a self-learning algorithm; and comparing the current operational state data with the past operational state data to determine potential for improvement in energy consumption of each of the plurality of energy consuming devices.

11. The computer-implemented method of claim 1, wherein the plurality of statistical results comprises one or more graphs, one or more charts, one or more tables and one or more statistical maps of energy consumption as a function of duration of the operations of the plurality of energy consuming devices, energy storage and supply capacity of the plurality of energy storage and supply means, environmental conditions and energy pricing affecting the one or more built environments.

12. The computer-implemented method of claim 1, further comprising storing, at the energy demand control system with the processor, the first set of statistical data, the second set of statistical data, the third set of statistical data, the fourth set of statistical data, the fifth set of statistical data, the plurality of statistical results, key performance indicators and a log file having the one or more control routines in a database, wherein the storing being done in real time.

13. The computer-implemented method of claim 1, further comprising updating, at the energy demand control system with the processor, the first set of statistical data, the second set of statistical data, the third set of statistical data, the fourth set of statistical data, the fifth set of statistical data, the plurality of statistical results, key performance indicators and a log file having the one or more control routines, wherein the updating being done in real time.

14. The computer-implemented method of claim 1, further comprising displaying, at the energy demand control system with the processor, the first set of statistical data, the second set of statistical data, the third set of statistical data, the fourth set of statistical data, the fifth set of statistical data, the plurality of statistical result, key performance indicators and a log file having the one or more control routines, wherein the displaying being provided on one or more statistical monitoring devices in real time.

15. A computer system comprising:
one or more processors; and
a memory coupled to the one or more processors, the memory for storing instructions which, when executed by the one or more processors, cause the one or more processors to perform a method for manipulating load curves corresponding to time-variant energy demand and consumption of a built environment associated with one or more renewable energy sources, the method comprising:

analyzing, at an energy demand control system, a first set of statistical data associated with a plurality of energy consuming devices, a second set of statistical data associated with an occupancy behavior of a plurality of users, a third set of statistical data associated with a plurality of energy storage and supply means, a fourth set of statistical data associated with a plurality of environmental sensors and a fifth set of statistical data associated with a plurality of energy pricing models and wherein the analyzing being done by performing one or more statistical functions to generate a plurality of statistical results;

executing, at the energy demand control system, one or more control routines for controlling peak loading conditions associated with the built environment, wherein the execution being performed based on the plurality of statistical results, wherein the one or more control routines being executed by performing at least one of a plurality of control techniques and wherein the plurality of control techniques being performed for generating an optimized time variant energy demand and consumption and rendering one or more gradual load curves associated with the built environment;

manipulating, at the energy demand control system, an operating state of each of the plurality of energy consuming devices, wherein the operating state of the plurality of energy consuming devices being manipulated by time-variant shifting of energy usage of each selected energy consuming device of the plurality of energy consuming devices in a scheduled energy usage profile of the selected energy consuming device of the plurality of energy consuming devices, wherein the time-variant shifting and scheduling being performed for generating a peak level of energy demand concentrated over a limited period of time and rendering one or more steep load curves associated with the built environment;

integrating, at the energy demand control system, the plurality of energy storage and supply means for providing an equivalent real time energy supply to selected energy consuming devices of the plurality of energy consuming devices, wherein the integration being performed based on validation of an increase in the energy demand above a threshold level, wherein the integration being performed for optimally reducing the peak level of energy demand concentrated over the limited period of time and wherein the optimal reduction of the peak level of energy demand provides at least one of a first potential for optimum charge and a second potential of optimum discharge of the plurality of energy storage and supply means over a period of time.

16. The computer system of claim 15, further comprising storing, at the energy demand control system, the first set of statistical data, the second set of statistical data, the third set of statistical data, the fourth set of statistical data, the fifth set of statistical data, the plurality of statistical results, key performance indicators and a log file having the one or more control routines in a database, wherein the storing being done in real time.

17. The computer system of claim 15, further comprising updating, at the energy demand control system, the first set of statistical data, the second set of statistical data, the third set of statistical data, the fourth set of statistical data, the fifth set of statistical data, the plurality of statistical results, key performance indicators and a log file having the one or more control routines, wherein the updating being done in real time.

18. A non-transitory computer-readable storage medium encoding computer executable instructions that, when executed by at least one processor, performs a method for manipulating load curves corresponding to time-variant energy demand and consumption of a built environment associated with one or more renewable energy sources, the method comprising:

analyzing, at a computing device, a first set of statistical data associated with a plurality of energy consuming devices, a second set of statistical data associated with an occupancy behavior of a plurality of users, a third set of statistical data associated with a plurality of energy storage and supply means, a fourth set of statistical data associated with a plurality of environmental sensors and a fifth set of statistical data associated with a plurality of energy pricing models and wherein the analyzing being done by performing one or more statistical functions to generate a plurality of statistical results;

executing, at the computing device, one or more control routines for controlling peak loading conditions associated with the built environment, wherein the execution being performed based on the plurality of statistical results, wherein the one or more control routines being executed by performing at least one of a plurality of control techniques and wherein the plurality of control techniques being performed for generating an optimized time variant energy demand and consumption and rendering one or more gradual load curves associated with the built environment;

manipulating, at the computing device, an operating state of each of the plurality of energy consuming devices, wherein the operating state of the plurality of energy consuming devices being manipulated by time-variant shifting of energy usage of each selected energy consuming device of the plurality of energy consuming devices in a scheduled energy usage profile of the selected energy consuming device of the plurality of energy consuming devices, wherein the time-variant shifting and scheduling being performed for generating a peak level of energy demand concentrated over a limited period of time and rendering one or more steep load curves associated with the built environment;

integrating, at the computing device, the plurality of energy storage and supply means for providing an equivalent real time energy supply to the selected energy consuming devices of the plurality of energy consuming devices, wherein the integration being performed based on validation of an increase in the energy demand above a threshold level, wherein the integration being performed for optimally reducing the peak level of energy demand concentrated over the limited period of time and wherein the optimal reduction of the peak level of energy demand provides at least one of a first potential for optimum charge and a second potential of optimum discharge of the plurality of energy storage and supply means over a period of time.

19. The computer readable storage medium of claim 18, further comprising instructions for storing at the computing device, the first set of statistical data, the second set of statistical data, the third set of statistical data, the fourth set of statistical data, the fifth set of statistical data, the plurality of statistical results, key performance indicators and a log file having the one or more control routines in a database, wherein the storing being done in real time.

20. The computer readable storage medium of claim 18, further comprising instructions for updating at the computing device, the first set of statistical data, the second set of statistical data, the third set of statistical data, the fourth set of statistical data, the fifth set of statistical data, the plurality of statistical results, key performance indicators and a log file having the one or more control routines, wherein the updating being done in real time.

\* \* \* \* \*